United States Patent
Kawai et al.

(10) Patent No.: US 7,012,261 B2
(45) Date of Patent: Mar. 14, 2006

(54) MULTIPOLE LENS, CHARGED-PARTICLE BEAM INSTRUMENT FITTED WITH MULTIPOLE LENSES, AND METHOD OF FABRICATING MULTIPOLE LENS

(75) Inventors: Eiji Kawai, Kanagawa (JP); Joachim Zach, Heidelberg (DE); Klaus Hessenauer, Heidelberg (DE)

(73) Assignee: JEOL, Ltd., Tokyo (JP)

( * ) Notice: Subject to any disclaimer, the term of this patent is extended or adjusted under 35 U.S.C. 154(b) by 29 days.

(21) Appl. No.: 10/874,797

(22) Filed: Jun. 23, 2004

(65) Prior Publication Data

US 2005/0029466 A1 Feb. 10, 2005

(30) Foreign Application Priority Data

Jun. 24, 2003 (JP) .................................... 2003-179523

(51) Int. Cl.
*G21K 1/08* (2006.01)
*H01J 3/14* (2006.01)

(52) U.S. Cl. ..................... 250/396 R; 250/396 ML; 250/492.1; 250/492.2; 250/492.21; 250/492.3; 250/505.1; 250/517.1; 250/306; 250/307; 250/309; 250/310; 250/311; 313/389; 430/942

(58) Field of Classification Search ...................... None
See application file for complete search history.

(56) References Cited

U.S. PATENT DOCUMENTS

| 3,387,241 A | * | 6/1968 | Audoin et al. | ............... 335/210 |
| 4,039,810 A | * | 8/1977 | Heritage | ............... 250/396 ML |
| 2004/0251423 A1 | * | 12/2004 | Kawai | ..................... 250/396 R |
| 2005/0029466 A1 | * | 2/2005 | Kawai et al. | ........... 250/396 R |

FOREIGN PATENT DOCUMENTS

JP          02-230647          9/1990

* cited by examiner

*Primary Examiner*—John R. Lee
*Assistant Examiner*—Bernard E. Souw
(74) *Attorney, Agent, or Firm*—The Webb Law Firm

(57) ABSTRACT

A multipole lens producing less magnetic field variations is offered. Also, a charged-particle beam instrument fitted with such multipole lenses is offered. The multipole lens has plural polar elements, an annular holding member, and an annular yoke disposed outside the holding member. Each polar element has a held portion and a base-end portion. The held portions of the polar elements are held by the holding member. The yoke is magnetically coupled to the base-end portions of the polar elements. The yoke is provided with openings extending circumferentially. The base-end portions of the polar elements are positioned in the openings.

13 Claims, 6 Drawing Sheets

MULTIPOLE LENS, CHARGED-PARTICLE BEAM INSTRUMENT FITTED WITH MULTIPOLE LENSES, AND METHOD OF FABRICATING MULTIPOLE LENS

BACKGROUND OF THE INVENTION

1. Field of the Invention

The present invention relates to a multipole lens having multipolar elements, such as octupolar elements or dodecapole (twelve-pole) elements. The invention also relates to a charged-particle beam instrument fitted with such multipole lenses. Furthermore, the invention relates to a method of fabricating such a multipole lens.

2. Description of Related Art

In an observation system, such as a charged-particle beam instrument (e.g., a scanning electron microscope), aberration in the electron beam, i.e., charged-particle beam, is corrected when the beam is directed at a specimen in order to appropriately image the specimen. Within such an observation system, multipole lenses are mounted as an aberration corrector to correct the aberration in the electron beam.

One design of such multipole lenses is disclosed in Japanese Patent Laid-Open Application No. H2-230647. This known structure has plural (eight or twelve) polar elements which are supported by an annular holding member and by a yoke disposed outside the holding member. This multipole lens (multipolar elements) shown in FIG. 1 of the Japanese application has plural polar elements, a beam tube SR, and an annular yoke J made of an iron circuit and disposed outside the beam tube. Each of the polar elements consists of a mounting rod PH and a polepiece PS coupled to the front end of the mounting rod. The beam tube is provided with hermetically sealed holes for passage of the mounting rods of the polar elements.

Each polar element is fabricated by screwing the front-end portion of each mounting rod into the polepiece or adhesively bonding or welding them together. The mounting rods and polepieces forming the polar elements are made of a magnetic material. The beam tube is made of an electrically insulating material. A metal coating is formed around each hermetically sealed hole.

The mounting rod of each polar element has a base-end portion firmly joined to the yoke. In particular, the mounting rod is inserted into the corresponding hole in the yoke via an insulator IS. Thus, the mounting rods are aligned and firmly coupled to the yoke.

The mounting rods are hermetically and rigidly mounted in the hermetic holes in the beam tube by the aforementioned welding via the metal coating. As a result, the weldments form a hermetically sealed body.

A coil is mounted on each mounting rod between the beam tube and yoke. The polepiece joined to the front end of each mounting rod is magnetically excited by passing electrical current through the coil. The base-end portions of the mounting rods are positioned in the holes of the yoke via the insulator. Electrical terminals are connected with the base-end portions, respectively, such that a voltage is supplied to them.

In the multipole lens of the construction as described above, the base-end portions of the polar elements of the mounting rods are inserted in the holes formed in the yoke and aligned. Under this condition, the base-end portions are firmly coupled to the yoke in the holes.

In this case, the base-end portions of the polar elements are firmly coupled in the holes formed in the yoke and so undesired external force may be applied to the base-end portions of the polar elements via the holes in the yoke during the fabrication step for joining the base-end portions to the yoke. If this force is applied, the polar elements may be deformed during the joining step or the shape of the polar elements may vary with time even where the polar elements are aligned at the beginning.

As a result, the polepieces at the front ends of the polar elements may deviate in position. A positional deviation along the optical axis of the electron beam produces a local field variation along the optical axis in the region where a magnetic or electric field is produced by the multipole lens. This local field variation is produced only at the beam entrance and exit portions of the region where the field is produced. Therefore, this local field variation will not create a great obstacle in correcting aberration in the electron beam. However, positional deviations of the polepieces in a direction perpendicular to the optical axis of the beam will create non-local field variations over the whole region through which the beam passes. These non-local field variations occur along the optical axis in the region where the field is produced. Consequently, the non-local field variations will create a great obstacle in aberration correction of the beam.

In the example of the above-cited Japanese application, each polar element is fabricated by inserting the mounting rod into the beam tube and then connecting the polepiece to the front end of the mounting rod. In consequence, much labor is necessary to shape the formed polar element into desired form and dimensions. Furthermore, where the desired shape cannot be achieved due to the condition in which the mounting rod and polepiece are connected, a separate processing step is required.

SUMMARY OF THE INVENTION

It is an object of the present invention to provide a multipole lens producing less field variations. It is another object of the present invention to provide a charged-particle beam instrument fitted with multipole lenses. It is a further object of the present invention to provide a method of fabricating multipole lenses efficiently.

A multipole lens according to the present invention has a plurality of polar elements each having a held portion and a base-end portion, an annular holding member for holding the held portions of the polar elements, and an annular yoke disposed outside the holding member and magnetically coupled to the base-end portions of the polar elements. The yoke is provided with radial openings having a span extending circumferentially providing gaps from the base-end portions of the polar elements positioned in the openings.

A charged-particle beam instrument fitted with multipole lenses and built in accordance with the present invention has a source of a charged-particle beam, an illumination lens system for controlling the beam emitted by the source such that the beam focuses on a specimen, and the multipole lenses for correcting aberration in the beam. Each of the multipole lenses has a plurality of polar elements each having a held portion and a base-end portion, an annular holding member for holding the held portions of the polar elements, and an annular yoke disposed outside the holding member and magnetically coupled to the base-end portions of the polar elements. The yoke is provided with radial openings (slots) having a span extending circumferentially providing gaps from the base-end portions of the polar elements positioned in the openings.

In a method according to the present invention, a multipole lens having a plurality of polar elements and an annular holding member is fabricated. Each of the polar elements has a held portion and a front-end portion. The holding member holds the held portions of the polar elements. The method starts with passing the front-end portions of the polar elements through holes formed in the holding member. Then, the held portions of the polar elements are held to the holding member.

Other objects and features of the present invention will appear in the course of the description thereof, which follows.

DESCRIPTION OF THE PREFERRED EMBODIMENTS

The preferred embodiments of the present invention are hereinafter described in detail with reference to the drawings.

Figure 1:
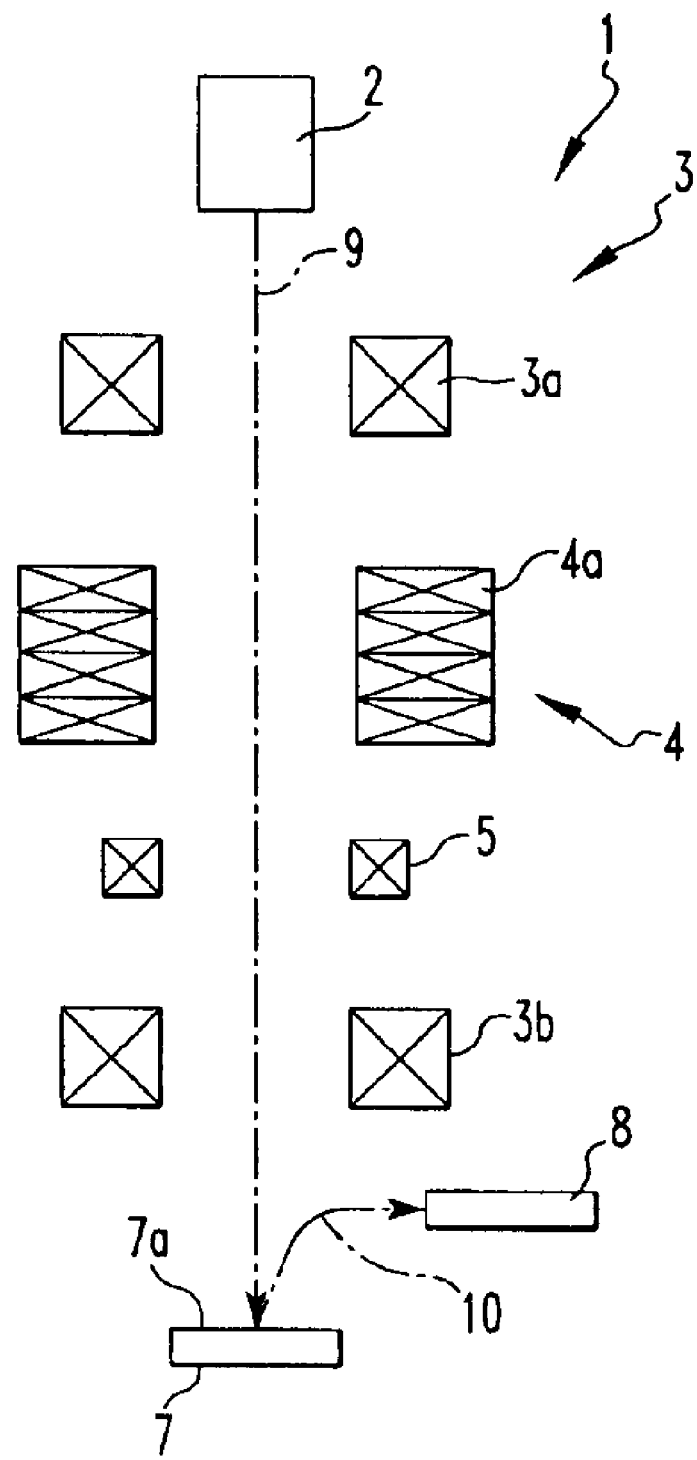
FIG. 1 is a schematic diagram of a charged-particle beam instrument fitted with multipole lenses according to the present invention.

FIG. 1 is a schematic diagram of an observation system (such as a charged-particle beam instrument) fitted with multipole lenses according to the invention. In the present embodiment, a scanning electron microscope is used as an example of the observation system. The scanning electron microscope, indicated by reference numeral 1, has an electron gun 2 acting as a source of a beam 9 of charged particles, condenser lenses 3a, an aberration corrector 4, scan coils 5, an objective lens 3b, and a detector 8.

In this scanning electron microscope 1, an electron beam (charged-particle beam) 9 emitted and accelerated from the electron gun 2 is controlled by an illumination lens system 3 and sharply focused onto an observed surface 7a of a specimen 7. The illumination lens system 3 is composed of the condenser lenses 3a and the objective lens 3b. At this time, the electron beam 9 is appropriately deflected and scanned over the observed surface 7a of the specimen 7 by the scan coils 5.

Electrons 10 to be detected, such as secondary electrons or backscattered electrons, are produced from the observed surface 7a of the specimen 7 according to the state of the observed surface 7a illuminated with the electron beam 9. The detected electrons 10 are detected by the detector 8 as a signal creating an observed image of the specimen 7. The output image signal from the detector 8 indicative of the detected electrons 10 is appropriately amplified and sent to a control circuit (not shown). Then, the signal is sent to a display means (not shown), such as a CRT (cathode-ray tube) or LCD (liquid-crystal display), and displayed as the observed image.

When the electron beam 9 is focused by the illumination lens system 3 and directed at the observed surface 7a of the specimen 7, the beam passes through the aberration corrector 4. This corrector 4 is used to correct aberration in the electron beam 9. In the present embodiment, the corrector 4 is made up of four stages 4a of multipole lenses, as an example. The number of stages 4a of the multipole lenses is not limited to four. The corrector may be made up of any arbitrary number of stages.

Figure 2:
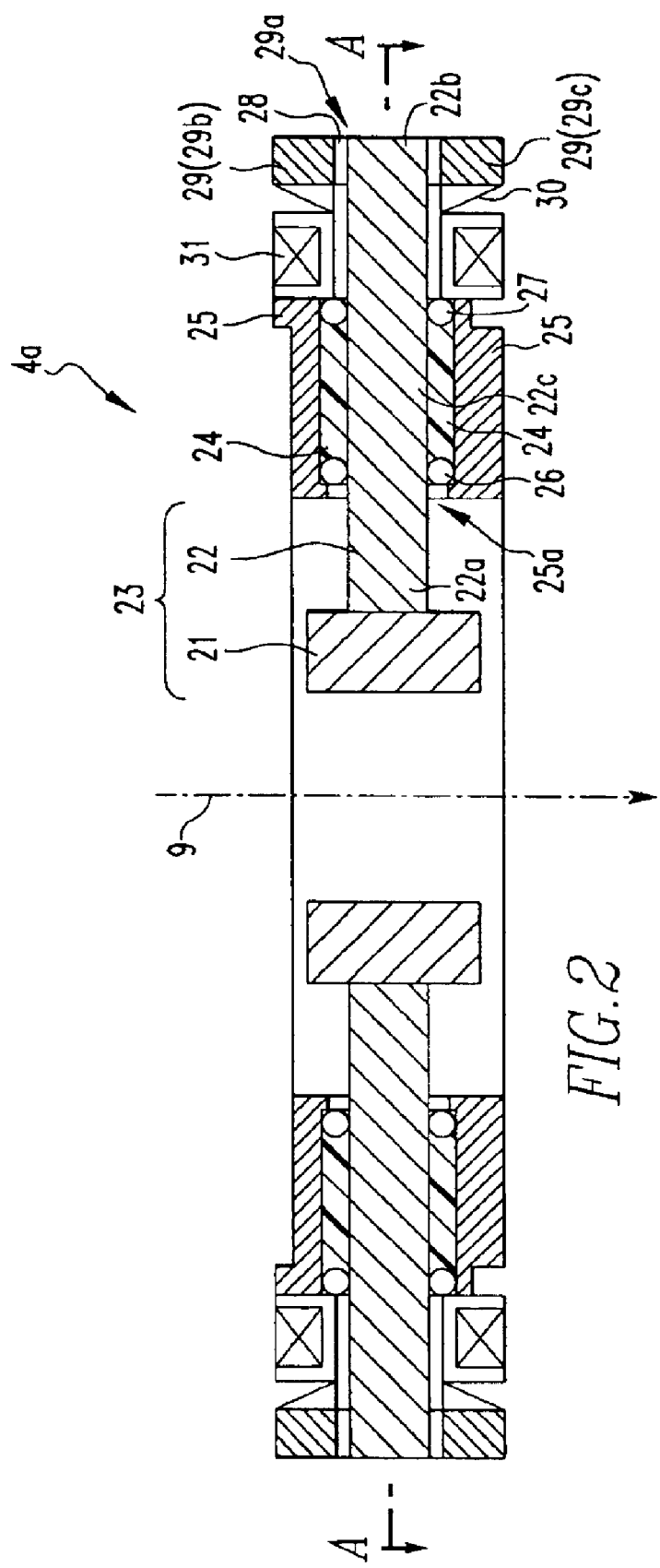
FIG. 2 is a cross-sectional view of a multipole lens according to the present invention.

FIG. 2 is a vertical cross-sectional view of one stage of multipole lens stage 4a forming the aberration corrector 4. This multipole lens stage 4a has polar elements 23, an annular holding member 25 for holding the polar elements 23, and an annular yoke 29 disposed outside the holding member 25. The polar element 23 is made up of a support rod 22 and a polepiece 21 mounted at the front end 22a of the rod 22. The rod 22 and polepiece 21 are made of a magnetic material, such as Permalloy or iron. The polepiece 21 can be mounted to the support rod 22 by screwing, adhesive bonding, welding, or other fixing method.

The support rods 22 forming the polar elements 23 have held portions 22c inserted in through-holes 25a formed in the holding member 25 made of a nonmagnetic material, such as brass or phosphor bronze. Seal members 26 and 27, each consisting of an O-ring or the like, are disposed at the opposite ends of each through-hole 25a. The region of the inside of the through-hole 25a which is located between the outer surface of the held portion 22c of the rod 22 and the inner surface of the through-hole 25a is filled with resin 24. The resin 24 is cured in this region of the inside of the through-hole 25a. Consequently, the held portion 22c of the support rod 22 is firmly mounted in the through-hole 25a in the holding member 25 via the cured resin 24. Thus, the polar element 23 is placed and held in position on the holding member 25 in its held portion 22c.

The support rod 22 forming the polar element 23 has a base-end portion 22b fitted in the yoke 29 made of a magnetic material such as Permalloy or iron. The yoke 29 is provided with openings 29a in which the base-end portions 22b of the support rods 22 are inserted. Thus, the support rods 22 of the polar elements 23 are magnetically coupled to the yoke 29. A power supply (not shown) for applying a given voltage is connected with the end surfaces of the base-end portions of the support rods 22.

A coil 31 for exciting the polar element 23 is disposed on the support rod 22 of each polar element 23 and between the holding member 25 and yoke 29. A leaf spring 30 is disposed between the coil 31 and yoke 29 to limit the position of the coil 31. A tubular insulator 28 is mounted on the outer surface of the base-end portion 22b of each rod 22 that faces the openings 29a in the yoke 29, leaf springs 30, and coils 31.

Figure 3:
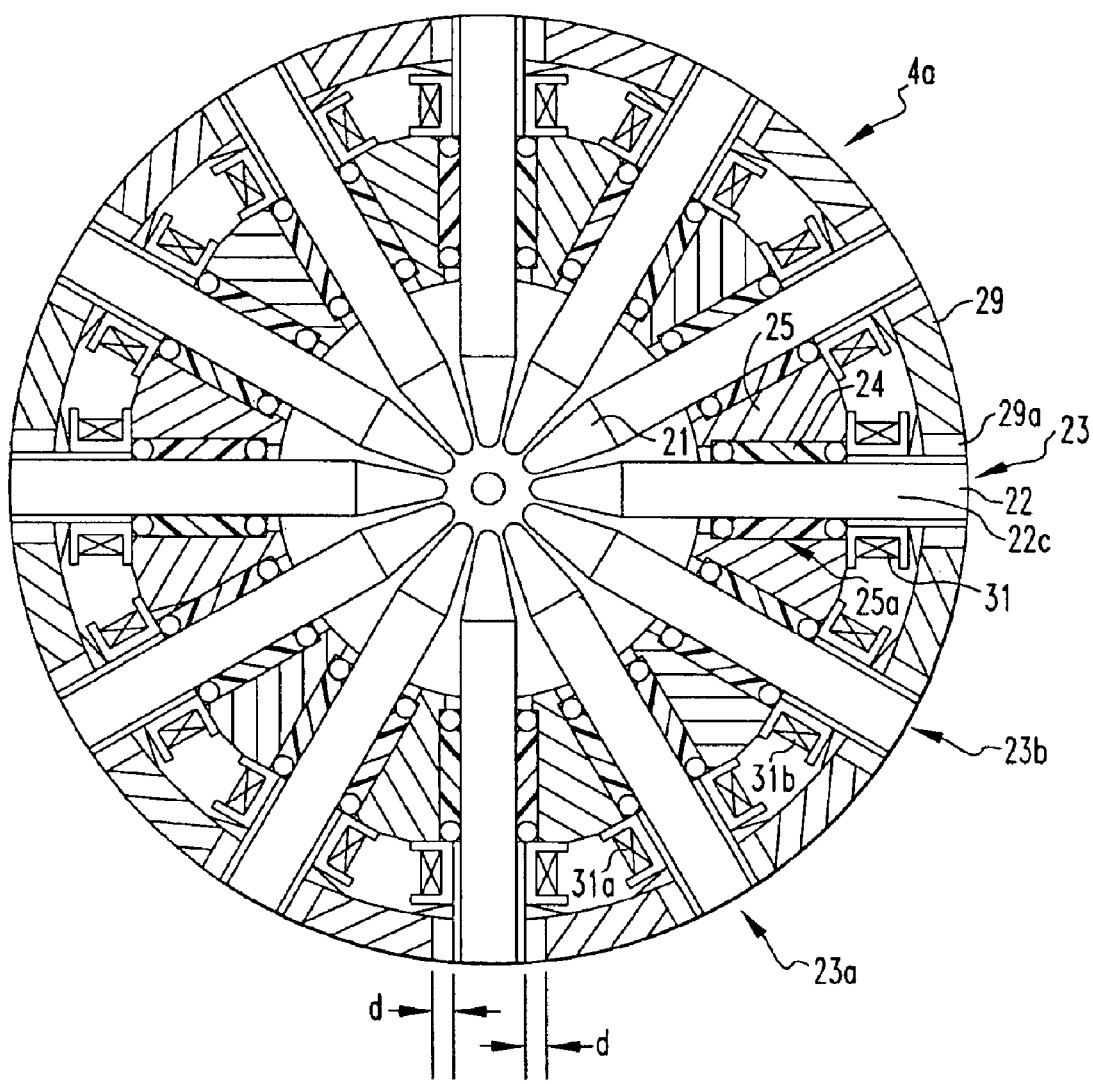
FIG. 3 is a cross-sectional view taken on line A—A of FIG. 2.

A cross section taken on line A—A of FIG. 2 is shown in FIG. 3. As shown in FIG. 3, the polar elements 23 are disposed radially about the optical axis of the electron beam 9. In the present embodiment, the multipole lens stage 4a has twelve polar elements 23. The holding member 25 is provided with the through-holes 25a corresponding to the support rods 22 of the polar elements 23. The held portions 22c of the rods 22 of the polar elements 23 are inserted in the through-holes 25a. The through-holes 25a are filled with the resin 24.

Figure 4:
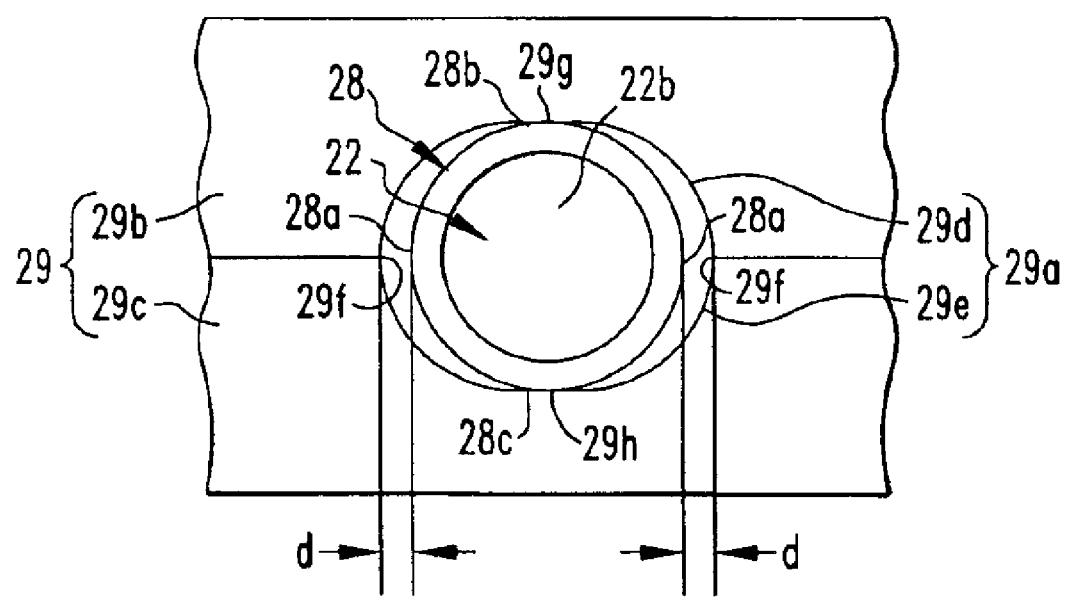
FIG. 4 is a side elevation of a main portion of the outer surface of a multipole lens according to the present invention.

The features of the multipole lens according to the present invention are described by referring to FIG. 4, which is a side elevation of a main portion of the outer surface of the multipole lens. As shown in this figure, the yoke 29 is composed of an upper annular part 29b and a lower annular part 29c. These two annular yoke parts 29b and 29c are positioned opposite and abutting to each other so as to overlap each other. The surfaces of the yoke parts 29b and 29c which face each other are provided with facing cutout portions 29d and 29e, respectively, spaced around the circumference of the yoke parts. The two yoke parts 29b and 29c are overlapped such that the cutout portions 29d and 29e face each other. Thus, the yoke 29 is formed.

At this time, the cutout portions 29d and 29e are disposed opposite to each other such that the base-end portion 22b of the support rod 22 forming the polar element is sandwiched between them. The two yoke parts 29b and 29c are overlapped to form the openings 29a in the yoke 29. The base-end portions 22b of the support rods 22 are disposed in the openings 29a. As a result, the base-end portion 22b of the support rod 22 is fitted between the cutout portions 29d and 29e formed in the two yoke parts 29b and 29c. The base-end portion 22b of each support rod 22 has a circular cross section. The tubular insulator 28 is mounted on the outer surface of the base-end portion 22b of the support rod 22 before the base-end portion is held between the cutout portions 29d and 29e. Accordingly, when the base-end portion 22b of the support rod 22 is fitted between the cutout portions 29d and 29e formed in the yoke parts 29b and 29c, the upper surface 28b and lower surface 28c of the insulator 28 formed on the outer surface of the base-end portion 22b provide lines in contact with central flat surfaces 29g and 29h in the cutout portions 29d and 29e, respectively.

The cutout portions 29d and 29e extend circumferentially of the yoke parts 29b and 29c, i.e., of the yoke 29. Therefore, the openings 29a in the yoke 29 formed by the cutout portions 29d and 29e have a span extending in the circumferential direction. In the present embodiment, the openings 29a in the yoke 29 are slots because of ease with which the yoke parts 29b and 29c are machined.

In this way, the base-end portions 22b of the support rods 22 forming the polar elements 23 are positioned in the openings 29a of the yoke 29. Consequently, a gap d (see FIGS. 3 and 4) is formed between the side surface 28a of the insulator 28 on the outer surface of the base-end portion 22b of the support rod 22 and the inner wall end surface 29f of each opening 29a in the yoke 29 as viewed in the radial direction (FIG. 4).

Thus, when the base-end portions 22b of the support rods 22 are coupled to the yoke 29, the side surface 28a of the insulator 28 will not touch the inner wall end surface 29f of the opening 29a. External force in the circumferential direction of the yoke 29 (i.e., in a direction perpendicular to the optical axis of the electron beam 9) is not applied to the base-end portions 22b from the inner wall surface (inner wall end surface 29f) of the opening 29a. Accordingly, unwanted external force perpendicular to the optical axis of the beam 9 is not applied to the support rods 22 forming the polar elements 23. The polepieces 21 will not deviate in position perpendicularly to the optical axis. Therefore, in the region where a magnetic field is produced by the multipole lens stage 4a, the magnetic field is prevented from varying throughout the whole region along the optical axis of the beam 9. Hence, aberration correction of the electron beam 9 is not hindered as much.

The exciting coils 31 are mounted in the regions located between the holding member 25 and yoke 29 on the support rods 22 of the polar elements 23. The connection between the coils 31 mounted on the mutually adjacent polar elements 23 is described by referring to FIG. 3.

In FIG. 3, if polar elements 23a and 23b are identified as mutually adjacent polar elements, the exciting coils mounted on the polar elements 23a and 23b are coils 31a and 31b, respectively. As these polar elements are positioned, the adjacent coils 31a and 31b are connected in series.

As mentioned previously, when the polar elements 23 are coupled to the yoke 29, unwanted external force in a direction perpendicular to the optical axis of the electron beam 9 is not applied to the support rods 22 of the polar elements 23. When the polar elements 23 are coupled to the yoke 29, deformation does not take place. Also, it is unlikely that the polar elements 23 deform with the elapse of time. The symmetry of the arrangement of each polar element 23 with respect to the optical axis is retained. Therefore, it is not necessary to connect a separate exciting power supply with each coil 31 on the polar elements 23. Consequently, it is only required to connect the mutually adjacent coils 31 (coils 31a and 31b in the above example) in series in turn and to connect one exciting power supply with the ends of the coils 31 positioned at the opposite ends of the series connection of all the polar elements 23. Furthermore, by connecting the coils 31 in series, voltage variations in the exciting power supply and noises act symmetrically to the electron beam 9 and cancel out each other. Therefore, their effects can be reduced. Another embodiment of the present invention is next described by referring to FIG. 5.

Figure 5:
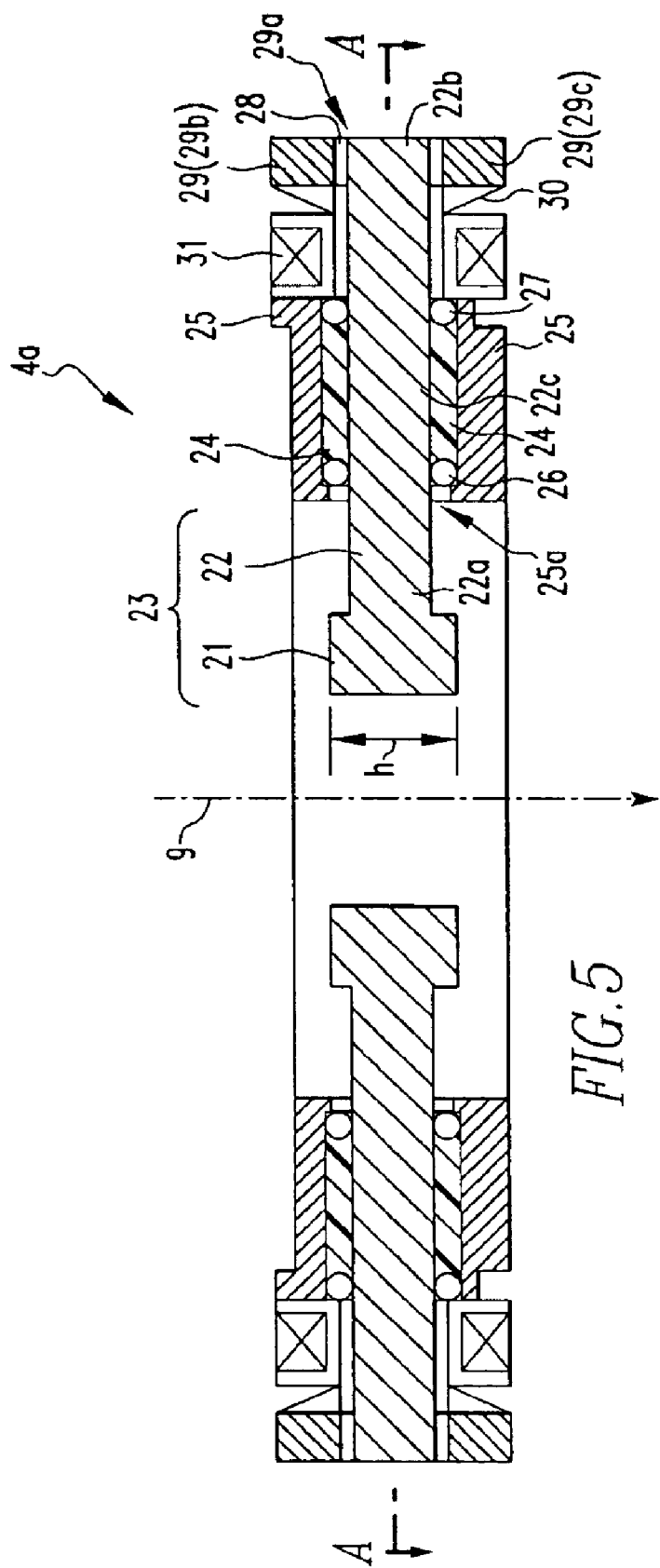
FIG. 5 is a cross-sectional view of a multipole lens according to another embodiment of the present invention.

FIG. 5 is a vertical cross-sectional view of a multipole lens stage 4a according to another embodiment of the present invention. This multipole lens stage 4a has a polar element 23 composed of a support rod 22 and a polepiece 21 located at the front end of the rod 22 in the same way as the multipole lens stage 4a shown in FIG. 2. In the embodiment shown in FIG. 5, however, the support rod 22 and polepiece 21 are formed integrally. The height h of the polepiece 21 is so determined that the polepiece can be inserted into the through-hole 25a in the holding member 25. Also, in this case, as shown in FIGS. 3 and 4, a gap d is formed between the side surface 28a of insulator 28 formed on the outer surface of the base-end portion 22b of the support rod 22 and the inner wall end surface 29f of the opening 29a in the yoke 29 as viewed in the circumferential direction. The same operation and advantages can be had as the foregoing.

Figure 6:
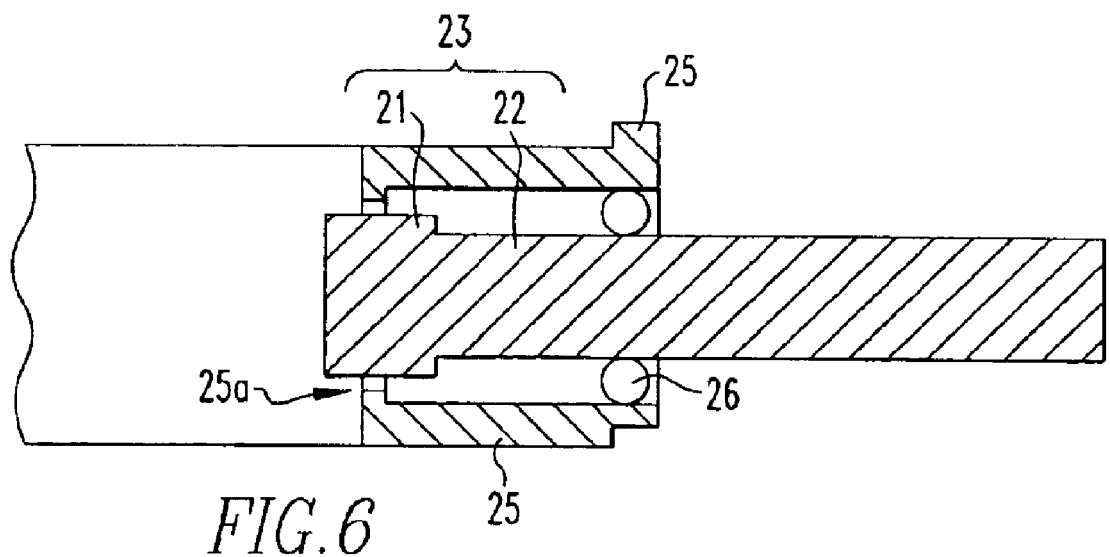
FIG. 6 is a cross-sectional view showing the state in which the polar elements of the multipole lens shown in FIG. 5 are being positioned.
Figure 7:
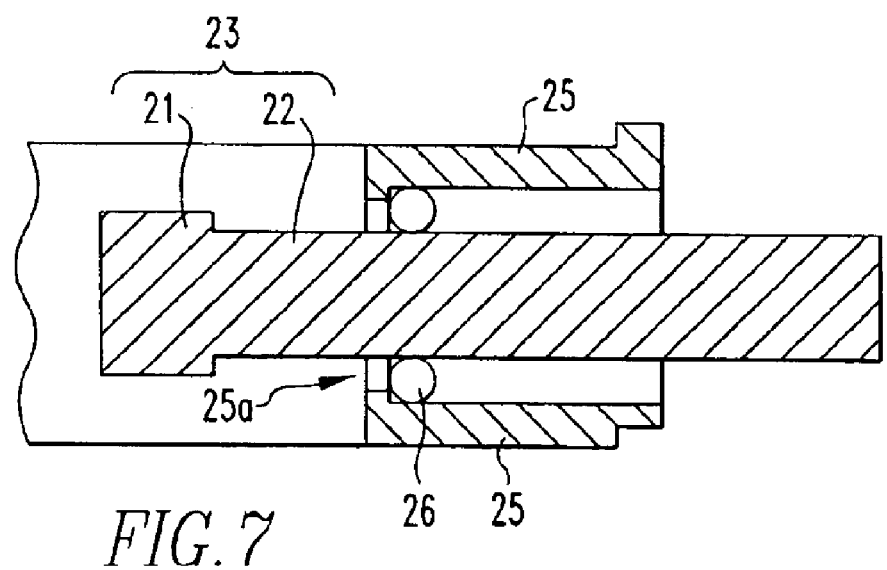
FIG. 7 is a cross-sectional view showing the state in which the polar elements of the multipole lens shown in FIG. 5 have been positioned.

A method of fabricating this example of multipole lens is described below by referring to FIGS. 6 and 7. FIG. 6 is a cross-sectional view showing the state in which the polar elements 23 of the multipole lens stage 4a shown in FIG. 5 are being positioned. FIG. 7 is a cross-sectional view showing the state in which the polar elements 23 of the multipole lens stage 4a have been positioned.

As shown in FIG. 6, each polar element 23 is fabricated by forming the support rod 22 and polepiece 21 integrally. Under this condition, the polepiece 21 of the polar element 23 is passed through the through-hole 25a in the holding member 25. Then, as shown in FIG. 7, the polar elements 23 are placed and held in position. One seal member 26 for sealing the through-hole 25a is previously mounted in position on the support rod 22 of each polar element 23.

Thereafter, as shown in FIG. 5, the held portions 22c of the support rods 22 are firmly held in the through-holes 25a in the holding member 25 by the resin 24. In this way, the polar elements 23 are fixed to the holding member 25 by holding the held portions 22c located in the holding member 25.

After placing the insulator 28, coils 31, and leaf springs 30 at given positions on the support rods 22 of the polar elements 23, the base-end portion 22b of each support rod 22 is held between the opposite cutout portions 29d and 29e formed in the two yoke parts 29b and 29c in the same way as the foregoing.

In the present embodiment, the polar elements in each of which the support rod and polepiece have been formed integrally are passed through the through-holes in the holding member. Therefore, polar elements having a desired shape formed as designed are selected and used for manufacture of a multipole lens. This makes it unnecessary to perform a separate machining step. Accordingly, multipole lenses can be fabricated efficiently.

Having thus described our invention with the detail and particularity required by the Patent Laws, what is desired protected by Letters Patent is set forth in the following claims.

The invention claimed is:

1. A multipole lens comprising:
    a plurality of polar elements each having a held portion and a base-end portion;
    an annular holding member for holding the held portions of the polar elements;
    an annular yoke disposed outside the holding member and magnetically coupled to the base-end portions of the polar elements; and
    circumferentially extending openings formed in the yoke, the base-end portions of the polar elements being positioned in the openings.

2. A multipole lens as set forth in claim 1, wherein said yoke is made of two annular parts disposed opposite to each other, the annular parts having surfaces opposite to each other, and wherein the surfaces of the annular yoke parts opposite to each other are provided with cutouts to form said openings.

3. A multipole lens as set forth in claim 1 or 2, wherein each of the openings in said yoke is a slot providing a gap from the base-end portion of the polar elements.

4. A multipole lens as set forth in claim 1 or 2, wherein a coil is mounted between the base-end portion of each of said polar elements and the corresponding held portion, and wherein the coils mounted on mutually adjacent ones of the polar elements are connected in series.

5. A charged-particle beam instrument fitted with multipole lenses, comprising:
    a source of a charged-particle beam;
    an illumination lens system for controlling the beam emitted by the source such that the beam focuses on a specimen; and
    the multipole lenses used for correcting aberration in the beam,
    wherein each of said multipole lens has a plurality of polar elements each having a held portion, an annular holding member for holding the held portions of the polar elements, and an annular yoke disposed outside the holding member and magnetically coupled to base-end portions of the polar elements, and
    wherein the yoke is provided with openings having a span extending circumferentially providing gaps from the base-end portions of the polar elements being positioned in the openings.

6. A charged-particle beam instrument fitted with multipole lenses as set forth in claim 5, wherein the yoke of each of said multipole lenses consists of two annular parts disposed opposite to each other, the annular parts having surfaces opposite to each other, and wherein the surfaces of the annular parts opposite to each other are provided with cutouts to form said openings.

7. A charged-particle beam instrument fitted with multipole lenses as set forth in claim 5 or 6, wherein each of the openings in the yoke of each of said multipole lenses is a slot.

8. A charged-particle beam instrument fitted with multipole lenses as set forth in claim 5 or 6, wherein a coil is mounted between the base-end portion of each of said polar elements of the multipole lenses and the corresponding held portion, and wherein the coils mounted on mutually adjacent ones of the polar elements are connected in series.

9. A charged-particle beam instrument fitted with multipole lenses as set forth in claim 5 or 6, wherein said charged-particle beam is an electron beam.

10. A method of fabricating a multipole lens having a plurality of polar elements and an annular holding member, each of the polar elements has a held portion and a front-end portion, the holding member holding the held portions of the polar elements, the holding member being provided with holes, the method comprising the steps of:
    passing the front-end portions of the polar elements through said holes formed in the holding member; and
    then holding the held portions of the polar elements to said holding member.

11. A method of fabricating a multipole lens as set forth in claim 10, wherein said multipole lens further includes an annular yoke disposed outside said holding member and magnetically coupled to base-end portions of said polar elements.

12. A method of fabricating a multipole lens as set forth in claim 11,
    wherein said yoke consists of two annular parts disposed opposite to each other, the annular parts having surfaces opposite to each other,
    wherein the opposite surfaces of the annular parts of the yoke are provided with cutouts, and
    wherein the base-end portions of said polar elements are fitted between the opposite cutouts formed in the yoke parts after the held portions of said polar elements are held to said holding member.

13. A method of fabricating a multipole lens as set forth in claim 12, wherein said opposite cutouts formed in said parts of the yoke extend circumferentially of said parts of the yoke.

* * * * *